(12) United States Patent
Cherry et al.

(10) Patent No.: US 7,835,782 B2
(45) Date of Patent: Nov. 16, 2010

(54) INTEGRATED PET-MRI SCANNER

(75) Inventors: Simon Cherry, Davis, CA (US);
Ciprian Catana, Maiden, MA (US);
Bernd J. M. Pichler, Tuebingen (DE)

(73) Assignee: The Regents of the University of California, Oakland, CA (US)

( * ) Notice: Subject to any disclaimer, the term of this patent is extended or adjusted under 35 U.S.C. 154(b) by 424 days.

(21) Appl. No.: 11/912,460

(22) PCT Filed: Apr. 28, 2006

(86) PCT No.: PCT/US2006/016386

§ 371 (c)(1),
(2), (4) Date: Oct. 24, 2007

(87) PCT Pub. No.: WO2006/119085

PCT Pub. Date: Nov. 9, 2006

(65) Prior Publication Data

US 2008/0214927 A1 Sep. 4, 2008

Related U.S. Application Data

(60) Provisional application No. 60/676,184, filed on Apr. 29, 2005.

(51) Int. Cl.
*A61B 5/05* (2006.01)
(52) U.S. Cl. ....................... 600/411; 600/407
(58) Field of Classification Search ........................ None
See application file for complete search history.

(56) References Cited

U.S. PATENT DOCUMENTS

| 2,855,520 | A | 10/1958 | Stoddart |
|---|---|---|---|
| 3,989,493 | A | 11/1976 | Barron |
| 4,939,464 | A | 7/1990 | Hammer |
| 6,060,883 | A | 5/2000 | Knuttel |
| 6,541,836 | B2 | 4/2003 | Iwanczyk |
| 2003/0090267 | A1* | 5/2003 | Rubashov .................... 324/318 |
| 2005/0113667 | A1* | 5/2005 | Schlyer et al. .............. 600/411 |

OTHER PUBLICATIONS

Shao et al, "Simultaneous PET and MR Imaging", Phys. Med. Biol. 42(1997) 1965-1970.*
Shao et al, "A Study of Depth of Interaction Measurement Using Bent Optical Fibers", IEEE Trans. Nuc. Sci., vol. 46, No. 3, Jun. 1999.*
Pichler et al, "Lutetium oxyorthosilicate block detector readout by avalanche photodiode arrays for high resolution animal PET", Phys. Med. Biol. 49 (2004) 4305-4319.*

* cited by examiner

*Primary Examiner*—Long V Le
*Assistant Examiner*—Nicholas L Evoy
(74) *Attorney, Agent, or Firm*—Park, Vaughan, Fleming & Dowler LLP

(57) ABSTRACT

One embodiment of the present invention provides an integrated PET-MRI scanner. This integrated scanner includes a main magnet that generates a magnetic field, wherein images of the subject is generated in a central region of the magnetic field. It also includes a PET scanner which is enclosed by the main magnet. The PET scanner further comprises: (1) at least one ring of scintillators, which is situated in the central region of the magnetic field and, (2) one or more photodetectors, which are coupled to the ring of scintillators, so that the one or more photodetectors are outside the central region of the magnetic field. The integrated scanner also includes radiofrequency (RF) coils which are enclosed by the PET scanner. By keeping the photodetectors and associated circuitry outside the central region of the magnetic field, the integrated scanner reduces the electromagnetic interference (EMI) between the PET scanner and the MRI scanner.

18 Claims, 13 Drawing Sheets

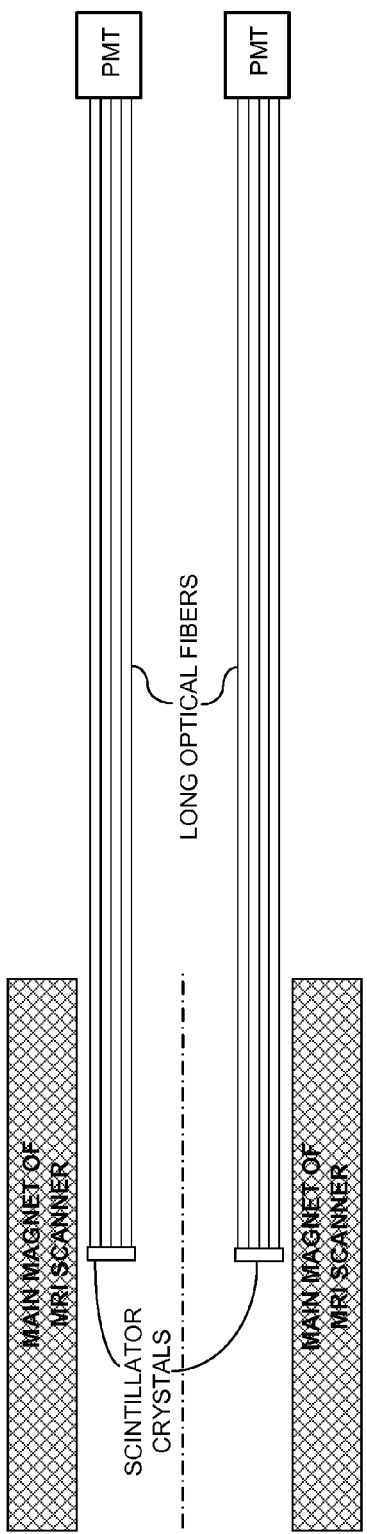
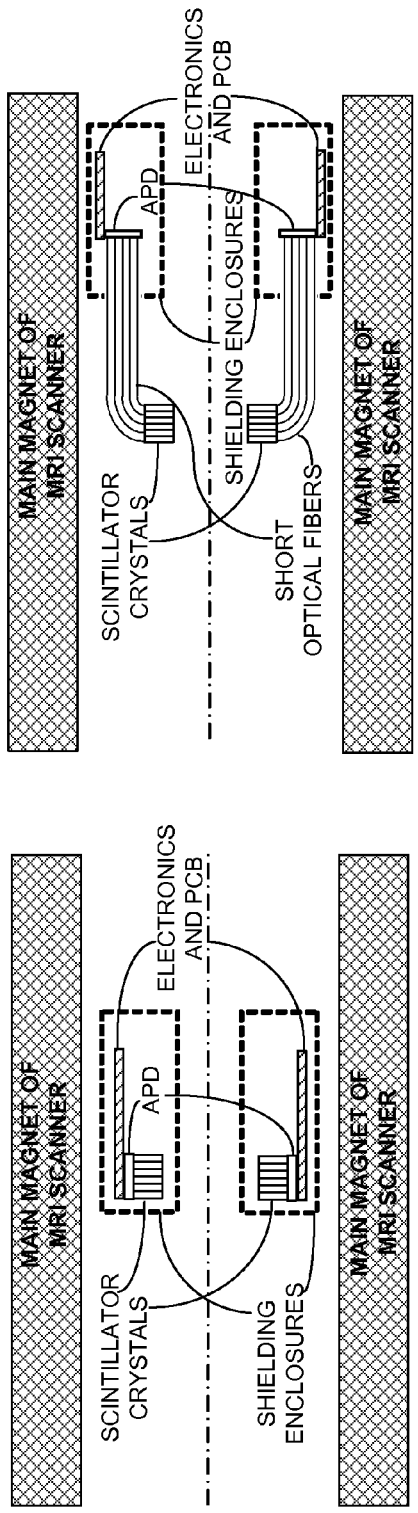
FIG. 1A (PRIOR ART)
FIG. 1B
FIG. 1C

A RING OF SCINTILLATORS WITH
16 8X8 SCINTILLATOR BLOCKS

AN 8X8 SCINTILLATOR BLOCK

FLOOD HISTOGRAM OF PET SCANNER INSERT 300

OUTSIDE THE MAGNET

INSIDE THE MAGNET WITHOUT RUNNING MRI SEQUENCES

INSIDE THE MAGNET WHILE RUNNING MRI SEQUENCES - SPIN ECHO

INSIDE THE MAGNET WHILE RUNNING MRI SEQUENCES - GRADIENT ECHO

Table 1. Characteristics of the Hamamatsu APDs.

| Characteristics | 2 x 2 mm² APD | | 3 x 3 mm² APD | | 5 x 5 mm² APD | |
|---|---|---|---|---|---|---|
| | No. 453 | No. 454 | No. 455 | No. 456 | No. 228 | No. 229 |
| Breakdown voltage (V) | 431 | 431 | 420 | 431 | 426 | 422 |
| Bias voltage at gain=50 (V) | 386.4 | 386.9 | 377.0 | 384.8 | 383.8 | 380.3 |
| Dark current at gain=50 (nA) | 0.84 | 0.84 | 0.59 | 0.65 | 6.7 | 7.3 |
| Terminal capacitance at gain=50 (pF) | 16 | 16 | 32 | 31 | - | - |

Table 2. Characteristics of the RMD 14 x 14 mm² PSAPDs.

| Characteristics | Typical values |
|---|---|
| Active area | 14x14 mm² |
| Gain at -1750 V | ~1000 |
| Terminal capacitance (pF) | ~140 pF |
| Quantum efficiency (400-700 nm) | 60% |
| Dark current at operating bias | 1-2 µA |
| Noise at gain 1000 | 300 electrons (FWHM) |
| Rise time | ~1 ns |

INTEGRATED PET-MRI SCANNER

BACKGROUND

1. Field of the Invention

The present invention generally relates to positron emission tomography (PET) and magnetic resonance imaging (MRI) technologies. More specifically, the present invention relates to a system and a method that integrates PET and MRI technologies into a combined scanner capable of simultaneous PET and MRI imaging.

2. Related Art

Positron emission tomography (PET) is a powerful molecular imaging modality that uses positron-emitting radionuclides attached to biologically relevant molecules to provide exceptionally sensitive assays of a wide range of biological processes. PET imaging is commonly used to diagnose cancer and to examine the effects of cancer therapy by characterizing biochemical changes in the cancer tissues. PET imaging has also been effective in detecting coronary artery diseases, brain disorders and other diseases.

Unfortunately, PET imaging has a serious drawback: the images produced by a PET scanner typically have relatively poor spatial resolution. This poor spatial resolution is the result of fundamental physical limitations of the PET process, which involve the mean-free-path of the positrons emitted by the radionuclides (i.e., positron range) and the non-colinearity of the two coincidence photons produced from a positron-annihilation event. Consequently, for many types of radiotracers used in the PET imaging process, their associated PET images often provide limited anatomical information, making unambiguous localization of the sources of the positron-emissions extremely difficult.

Note that the lack of spatial resolution in the PET images can affect the accuracy in quantifying PET data, which can cause significant underestimation of the actual isotope concentration in structures smaller than 2× the spatial resolution of the PET scanner. This inaccurate quantification of PET data can subsequently cause problems, for example, in interpreting PET images of tumors where a decrease in uptake of a radiotracer following treatment could indicate tumor shrinkage, a change in the biological function measured by the radiotracer, or both.

On the other hand, magnetic resonance imaging (MRI) is a widely utilized imaging technique that provides exquisite high-resolution anatomical information in the sub-millimeter range. Furthermore, MRI facilitates access to a range of physiologic parameters (e.g. water diffusion, permeability, vascular volume), and through spectroscopic imaging, to spatially-localized metabolic and biochemical information.

Because of these unique properties of the two imaging techniques, PET and MRI are largely complementary in the information they provide and merging these two modalities in the study of experimental animal models will allow us to exploit, in a synergistic fashion, the strengths of both techniques. Moreover, the accurate registration of simultaneously acquired MRI and PET images not only facilitates the anatomic localization of PET signals, but also provides information that can lead to improved quantification of the PET images through accurate attenuation correction (based on segmentation of the MR into different tissues types and assigning known tissue attenuation values), model-based estimates of scatter, and, most importantly, the potential for partial volume correction.

However, the task of integrating the two imaging modalities for simultaneous PET and MRI imaging presents many challenges. In particular, the PET scanner, which is typically the smaller modality of the two, will most likely be placed inside the MRI. In other words, the PET scanner will be immersed in the typically high magnetic field environment of the MRI. This can cause problems when combining PET and MRI, because there is a high probability of interference or interaction between the two systems in the form of electromagnetic interference (EMI). More specifically, the integrated PET-MRI system requires the PET detectors to work and work well in the high magnetic field environment. However, most of the photon detectors and associated electronics contain metal components and their performance is consequently sensitive to magnetic fields and electromagnetic signals. On the other hand, these metal components, when immersed in the magnetic field, can become magnetized and can subsequently introduce a magnetic field inside the MRI scanner, which can disturb the homogeneity of the main magnetic field and the associated gradient fields within the MRI scanner. Hence, these EMI effects, between the PET components and the MRI components, can cause potentially serious artifacts and reduce signal-to-noise ratio (SNR) in both the PET and MRI images.

Another challenge involved in combining PET and MRI imaging mechanisms relates to constructing a compact PET scanner that fits within a limited space inside the bore of the main magnet of the MRI scanner with high precision, so that the PET scanner is precisely aligned with the detectors of the MRI scanner, which allows the simultaneously generated PET and MRI images to have accurate registration.

Currently, there are a few approaches which are being investigated for combined PET-MRI systems. One of these approaches is to use 3-5 meter long optical fibers to couple scintillator elements placed inside the magnet of MRI to photomultiplier tubes (PMTs) and associated electronics located outside of the magnetic field. This approach is illustrated in FIG. 1A. Note that the long optical fibers are required because of the high sensitivity of PMTs to even small magnetic fields. By placing only the scintillator material inside the MR scanner, and keeping all of the PET readout electronics outside of the magnet, any EMI between the two imaging systems can be minimized.

However, there are several drawbacks to this approach. First, by using 3-5 meter long optical fiber to transmit the optical signal, a significant fraction (somewhere between 50% and 75%) of the scintillation light is lost, causing a deterioration in crystal identification, energy resolution and timing resolution in comparison to photon detectors that are directly coupled to the scintillators. A second problem is that achieving both high spatial resolution and high sensitivity in the PET image requires a large number of detector channels. However, because of the limited space inside conventional MR magnets, it is not practical to fiber-optically couple large numbers of fibers to external electronics.

A similar fiber-PMT-based approach for combining PET and MRI uses a split magnet low-field MR system. The split-magnetic approach allows a relatively large number of PET detectors to be placed inside the gap within the split magnets of the MR system, while also reducing the fiber lengths significantly compared with the single-magnet systems. Unfortunately, this approach has the drawback of requiring a specialized, lower-field magnet, which significantly limits the applicability of the combined system.

Another approach uses magnetic field-insensitive solid-state photon detectors—avalanche photodiodes (APDs), as replacements for PMTs, and couples these APDs directly to the back of the scintillator elements (FIG. 1B). Note that APDs are relatively immune to magnetic fields and have been demonstrated to work inside MRI scanners at fields as high as 9.4 T. A typical APD-based setup also requires a charge-sensitive preamplifier (CSP) to be placed as close as possible to the detector to minimize the capacitance, thereby ensuring lower noise and better signal quality. In addition, to shield the PET electronics from external high frequency signals from the MRI, these electronics have to be enclosed in metal housing. This approach solves the many limitations of fiber-optically coupled systems. However, placing many metal components within the central region of the MRI system introduces inevitable EMI between the main magnetic field, the RF coils and gradient coils of the MRI system, and the PET electronics. It is also questionable whether artifact-free simultaneous PET and MRI images can be acquired with such an approach.

Hence, what is needed is an integrated PET-MRI system that minimizes electromagnetic interference between the PET components and the MRI components, while taking advantage of the magnetic field insensitivity of photodetectors to produce high-resolution, high-sensitivity PET images without the above-described problems.

SUMMARY

One embodiment of the present invention provides an integrated positron emission tomography (PET)-magnetic resonance imaging (MRI) scanner. This integrated PET-MRI scanner includes a main magnet that generates a magnetic field during an MRI process, wherein the image of the subject is generated in a central region of the magnetic field. It also includes a PET scanner that detects the annihilation photons produced by positron decay within a subject during a PET imaging process, wherein the PET scanner is enclosed by the main magnet. The PET scanner further comprises: (1) at least one ring of scintillators that detect positron-annihilation photons and output light photons in response to the detected positron-annihilation photons, wherein the ring of scintillators is situated in the central region of the magnetic field and, (2) one or more photodetectors that convert the photons generated by the ring of scintillators into electrical signals, wherein the one or more photodetectors are coupled to the ring of scintillators, so that the one or more photodetectors are located outside of the central region of the magnetic field. The integrated PET-MRI scanner also includes a set of radio-frequency (RF) coils that transmit signals to and receive signals from the subject during the MRI process, wherein the set of RF coils are enclosed by the PET scanner. By keeping the photodetectors and associated circuitry outside of the central region of the magnetic field, the integrated PET-MRI scanner reduces the electromagnetic interference (EMI) between the PET scanner and the MRI scanner.

In a variation on this embodiment, the one or more photodetectors are coupled to the ring of scintillators through optical fibers, wherein one end of the optical fibers is attached to the outputs of the scintillators, and the other end of the optical fibers is attached to the inputs of the one or more photodetectors. These optical fibers transfer the photons generated by the ring of scintillators to the one or more photodetectors, wherein using the optical fibers facilitates keeping the photodetectors outside of the central region of the magnetic field.

In a further variation on this embodiment, the optical fibers are a fraction of the size of the main magnet, which limits light transmission loss.

In a further variation on this embodiment, the optical fibers include at least one cladding layer which reduces light transmission loss.

In a further variation on this embodiment, the optical fibers include more than one cladding layer which reduces light transmission loss.

In a further variation on this embodiment, the spaces between the optical fibers are filled with reflective material which reduces light transmission loss and decreases optical crosstalk between the optical fibers.

In a further variation on this embodiment, the optical fibers are bent sharply near the ring of scintillators in order to fit the optical fibers inside the main magnetic of the MRI.

In a further variation on this embodiment, the optical fibers can have: (1) circular cross-section; (2) rectangular cross-section; or (3) hexagonal cross-section.

In a variation on this embodiment, the at least one ring of scintillators includes multiple rings of scintillators to facilitate multi-slice PET scanning.

In a variation on this embodiment, the circuitry associated with the photodetectors includes amplifiers for amplifying the electrical signals generated by the photodetectors.

In a further variation on this embodiment, the amplifiers are charge-sensitive preamplifiers (CSPs).

In a variation on this embodiment, the scintillators can comprise: (1) lutetium oxyorthosilicate (LSO) crystals; (2) bismuth germinate (BGO) crystals; (3) gadolinium oxyorthosilicate (GSO) crystals; (4) LYSO (a mixture of LSO and yttrium oxyorthosilicate) crystals; and (5) mixed lutetium silicates (MLS) crystals.

In a variation on this embodiment, the one or more photodetectors can comprise: (1) avalanche photodetectors (APDs); and (2) position-sensitive photodetectors (PSPDs), which include position-sensitive avalanche photodiodes (PSAPDs).

In a further variation on this embodiment, each PSAPD is used to readout a block or an array of scintillators in the ring of scintillators.

In a further variation on this embodiment, the PSAPD produces a position map for the block or the array of scintillators which indicates the light intensity distribution across of the block or the array of scintillators.

In a further variation on this embodiment, an array of the APDs is used to readout a block or an array of scintillators in the ring of scintillators.

In a variation on this embodiment, the photodetectors and associated circuitry of the PET scanner are contained within a magnetic field produced by the main magnet of the MRI.

In a variation on this embodiment, the integrated PET-MRI scanner further comprises a shield configured to shield the photodetectors and associated circuitry of the PET scanner from the RF signals generated by the RF coils of the MRI.

In a variation on this embodiment, the MRI can be: (1) a low-field MRI; or (2) a high-field MRI.

BRIEF DESCRIPTION OF THE FIGURES

FIG. 1A illustrates an integrated PET-MRI scanner which uses long optical fibers to couple scintillator crystals placed inside the magnet of MRI to photomultiplier tubes (PMTS) and associated electronics placed outside the magnetic field.

FIG. 1B illustrates an integrated PET-MRI scanner which uses magnetic field-insensitive avalanche photodiodes (APDs) coupled directly to the back of the scintillator elements.

FIG. 1C illustrates an integrated PET-MRI system which couples scintillator crystals through short optical fibers to avalanche photodetectors (APDs) and associated electronics in accordance with an embodiment of the present invention.

Table 1 provides specifications of a set of Hamamatsu APDs with different active surface areas.

Table 2 provides specifications of a Radiation Monitoring Devices PSAPD with 14×14 $mm^2$ active surface areas.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Overall Structure of the Integrated PET-MRI Scanner

FIG. 1C illustrates an integrated PET-MRI system which couples scintillator crystals through short optical fibers to avalanche photodetectors (APDs) and associated electronics in accordance with an embodiment of the present invention. In doing so, the electronics and other metal components (e.g., shielding enclosures) of the PET scanner reside outside the central region of the magnetic fields of the MRI scanner, but still inside of the main magnet. Hence, the total length of the optical fibers can be significantly reduced in this setup and the APDs and their dedicated printed circuit boards (PCBs) and electronics can be placed so that they are less likely to interfere with the MRI scanner.

Figure 2A:
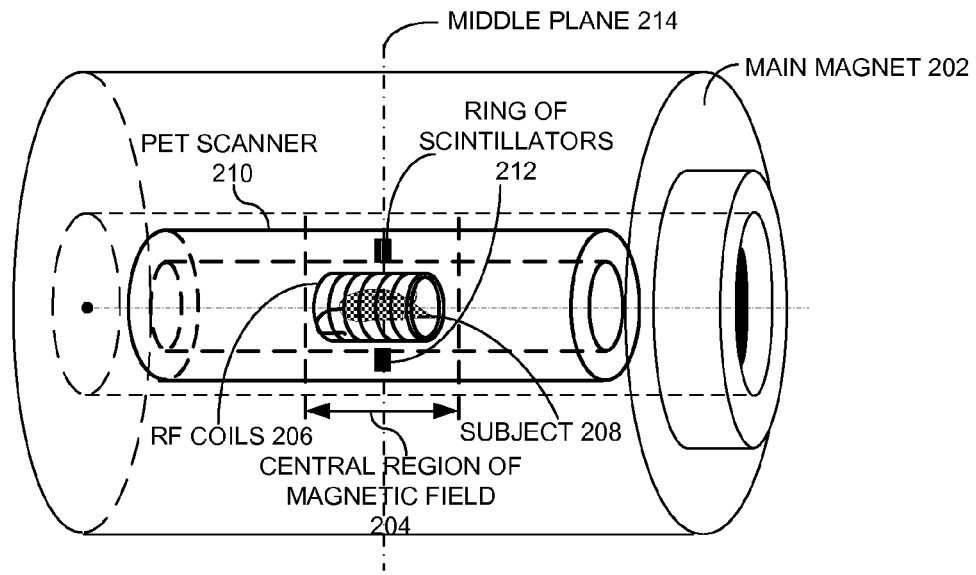
FIG. 2A presents a schematic of an integrated PET-MRI scanner illustrating the spatial relationships between the main components in accordance with an embodiment of the present invention.

FIG. 2A presents a schematic of an integrated PET-MRI scanner 200 illustrating the spatial relationships between the main components in accordance with an embodiment of the present invention.

Note that integrated PET-MRI scanner 200 comprises an MRI scanner, which includes a main magnet 202 that has a hollow cylindrical geometry. Main magnet 202 is typically the largest and outermost component in integrated PET-MRI scanner 200. Note that main magnet 202 can include, but is not limited to a permanent magnet, a resistive electromagnet, and a superconducting electromagnet. Main magnet 202 generates a strong and uniform magnetic field $B_0$ during an MR imaging process for a subject. Because the magnetic field $B_0$ is most uniform in a central region 204 along the main axis of main magnet 202, the MR image is typically acquired within this region.

The MRI scanner additional includes a set of radio-frequency (RF) coils 206, which are also known as RF resonators and RF probes. Note that RF coils 206 are generally located within central region 204 of the magnetic field. In another embodiment of the present invention, the RF coils may not be entirely contained within the central region of the magnetic field.

These RF coils 206 can have two functions. They can both (1) transmit RF signals to and (2) receive RF signals from a subject during an MR imaging process. For the first function, RF coils generate an RF pulse oscillating at the Larmor frequency of the spins, which excites the nuclei in the subject that are to be imaged. For the second function, RF coils detect the signals at the similar frequency emitted by the same nuclei during their "relaxation" to the original states. Note that a subject 208 (e.g., a mouse or rat) which is being imaged is placed inside RF coils 206, so that subject 208 is also within central region 204 of the magnetic field $B_0$.

Integrated PET-MRI scanner 200 further comprises a PET scanner 210, which is typically constructed to have a cylindrical geometry which facilitates integrating it with the MR scanner. Specifically, PET scanner 210 is placed inside the bore of main magnet 202, which is generally along the main axis of main magnet 202. Note that PET scanner 210 encloses RF coils 206, so that PET scanner 210 also encloses subject 208 as illustrated in FIG. 2A.

PET scanner 210 includes one or more rings of scintillators 212 which are located near the center of PET scanner 210. Additionally, rings of scintillators 212 are also located within central region 204 of MR magnetic field $B_0$. In one embodiment of the present invention, each ring of scintillators can generate one slice of a PET image for subject 208. Hence, multiple rings of scintillators can simultaneously generate multiple slices PET images for subject 208.

More specifically, each ring of scintillators collects high energy (511 keV) annihilation photons produced by positron-electron annihilations, wherein the positrons are emitted within the slice of subject 208 which is enclosed by the ring of scintillators. Next, each of the high-energy photons that are collected by the scintillators interacts with the scintillators to produce several hundreds to thousands of low energy photons in the form of UV or visible light photons.

Note that rings of scintillators 212 can be constructed in different ways. In one embodiment of the present invention, rings of scintillators 212 may comprise multiple layers of scintillator elements in the direction along the main axis of PET scanner 210. In another embodiment of the present invention, rings of scintillators 212 can comprise multiple layers of scintillator crystals in the direction perpendicular to the main axis of PET scanner 210. Furthermore, rings of scintillators 212 can be divided into a number of scintillator blocks, wherein each scintillator block is responsible for detecting an arc of area in one slice of a PET image.

Although not shown in detail in FIG. 2A, PET scanner 210 also includes electronics (e.g., photodetectors and associated preamplifiers) and other metal components (e.g., shielding enclosures). These electronics and metal components of PET scanner 210 reside outside central region 204 of the magnetic fields, and will be described in more details below.

Also not shown in FIG. 2A, the MR scanner also includes a set of gradient coils, which generates field gradients onto the main field $B_0$ in the x, y, and z directions. The field gradients are used to encode the distance information in the space where the subject is located. In one embodiment of the present invention, the set of gradient coils is situated so that they enclose PET scanner 210. In another embodiment of the present invention, the set of gradient coils is placed so that they are enclosed by PET scanner 210. Generally, integrated PET-MRI scanner 200 is constructed so that PET scanner 210 is inserted in the open space of the MR scanner between the inner surface of main magnet 202 and RF coils 206.

Figure 2B:
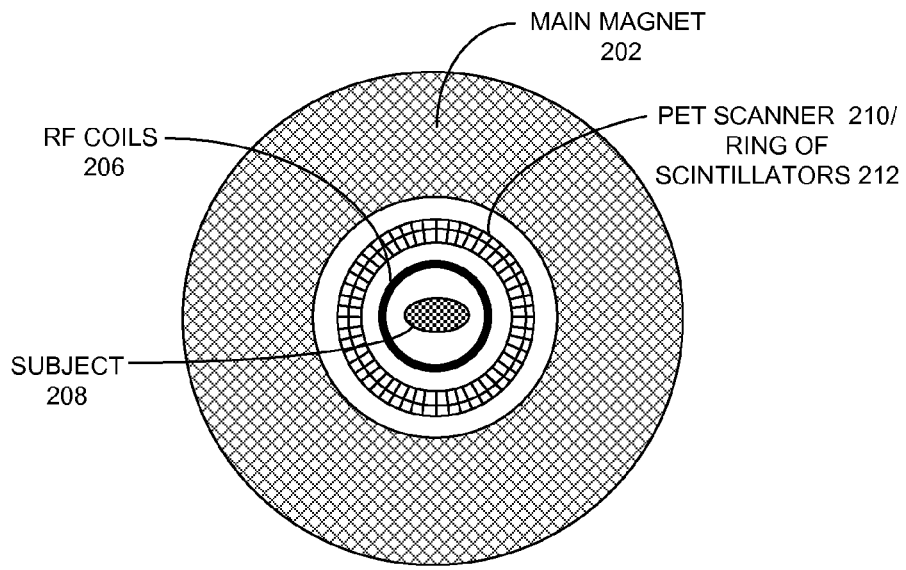
FIG. 2B presents a cross-sectional view of integrated PET-MRI scanner through a middle plane illustrating the spatial relationships between the main components in accordance with an embodiment of the present invention.

FIG. 2B presents a cross-sectional view of integrated PET-MRI scanner 200 through a middle plane 214 illustrating the spatial relationships between the main components in accordance with an embodiment of the present invention. Note that all the components are generally constructed concentrically or nearly concentrically with respect to the main axis of main magnet 202. Although it is desirable to have all the components arranged this way, it is also likely that one or more components are slightly off-axis in the actual setup.

A PET Scanner Insert Details

Figure 3:
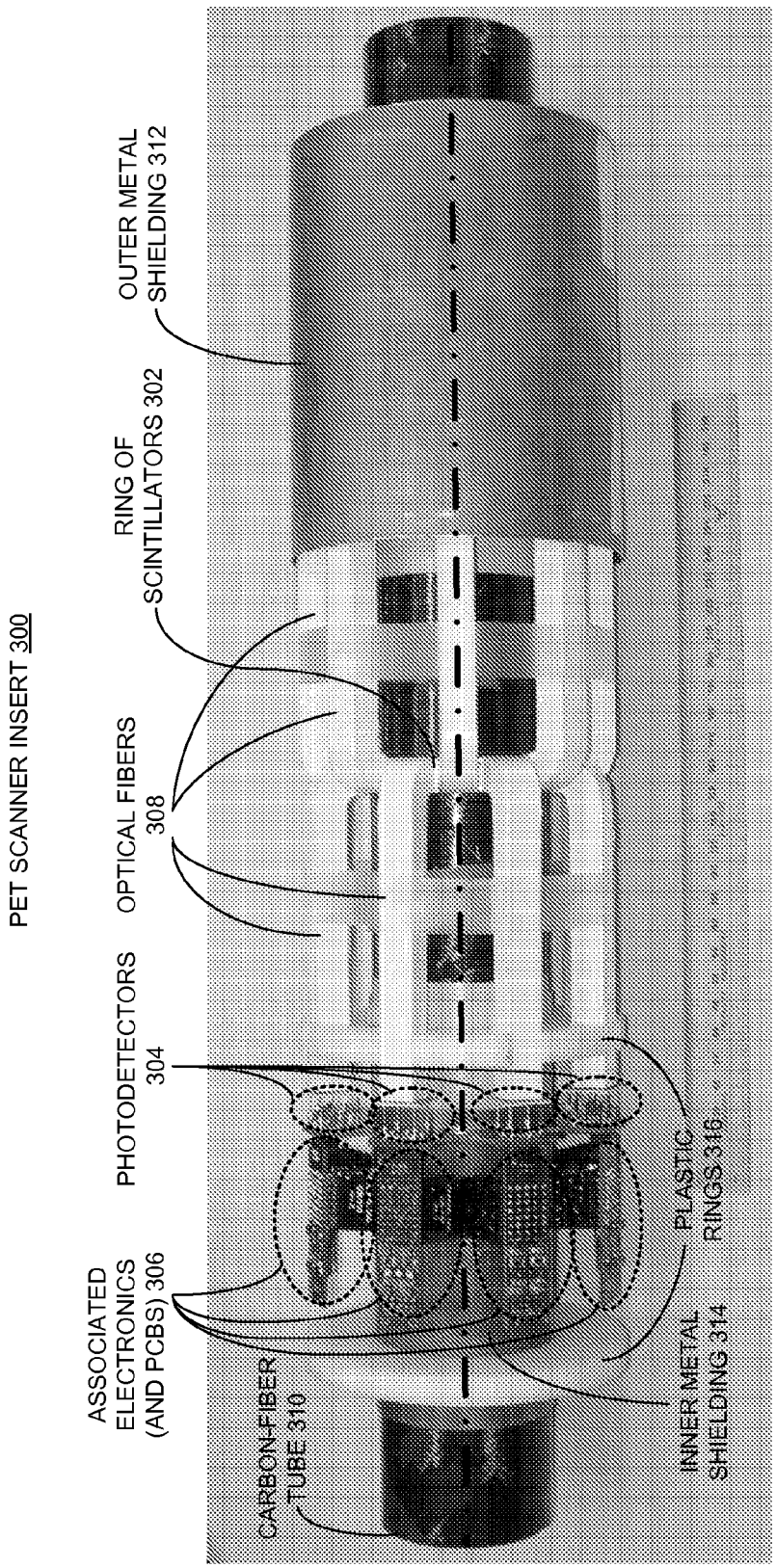
FIG. 3 presents a picture illustrating a custom-built PET scanner which is suitable for an integrated PET-MRI scanner in accordance with an embodiment of the present invention.

FIG. 3 presents a picture illustrating a custom-built PET scanner insert 300 which is suitable for an integrated PET-MRI scanner in accordance with an embodiment of the present invention.

Scintillators

PET scanner insert 300 includes one ring of scintillators 302 which is located in the middle of the cylindrical scanner. However, ring of scintillators 302 is only marginally visible in FIG. 3 because it is underneath the optical fiber couplers which will be described in more detail below.

Ring of scintillators 302 further comprises a set of scintillator blocks, wherein each scintillator block in the set further comprises an array of individual scintillator elements. FIG. 4A illustrates an 8×8 array of scintillator elements as one scintillator block in the ring of scintillators in accordance with an embodiment of the present invention. The top surface of the block is the receiving end of the high energy photons, thus facing the subject being imaged in the PET scanner. Note that each crystal element in the block has parallelepiped geometry with a parallelogram cross-section, which facilitates packing a group of elements into the array of scintillator elements. Alternatively, the crystals can also have cylindrical geometries with circular cross-sections.

Figure 4B:
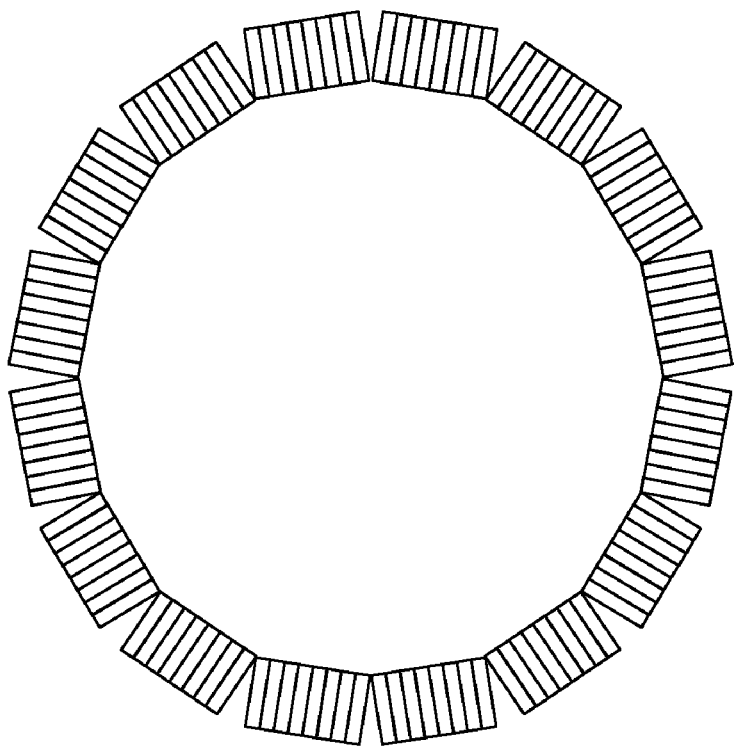
FIG. 4B illustrates a cross-sectional view of the ring of scintillators, which comprises a set of scintillator blocks in accordance with an embodiment of the present invention.
Figure 4A:
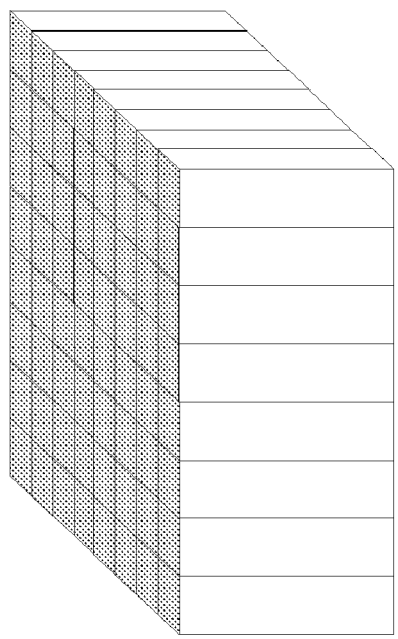
FIG. 4A illustrates an 8×8 array of scintillator elements as one scintillator block in the ring of scintillators in accordance with an embodiment of the present invention.

FIG. 4B illustrates a cross-sectional view of ring of scintillators 302, which comprises a set of scintillator blocks of FIG. 4A in accordance with an embodiment of the present invention. Note that the ring of scintillators in FIG. 4B comprises 16 of the 8×8 scintillator blocks.

Note that maximizing light photon collection by the scintillator elements following a high-energy photon interaction is desirable for many reasons, such as for crystal identification by a following PET photodetector, and energy resolution and timing resolution. There are a few techniques that can improve the photon collection capability of the scintillators. Note that each face of a scintillator element can be prepared by saw-cutting, chemical etching, or mechanical polishing. Mechanical polishing of the surfaces facilitates increasing the light collection (by improving internal reflection along the sidewalls of the crystal element), which in turn improves the energy and the timing resolution.

In one embodiment of the present invention, the spaces between the scintillator elements in a scintillator block can be filled with reflective materials to further increase the internal reflection along the sidewalls of the crystals, while decreasing the crosstalk between neighboring crystals. In one embodiment of the present invention, lutetium oxyorthosilicate (LSO) crystals are used as scintillator crystals because LSO combines good stopping power (attenuation length=1.1 cm at 511 keV) with excellent light yield (~25,000 photons per MeV). However, the scintillator crystals can also include, but are not limited to, bismuth germanate (BGO), gadolinium oxyorthosilicate (GSO), LYSO (a mixture of LSO and yttrium oxyorthosilicate), and mixed lutetium silicates (MLS).

Photodetectors

Referring back to FIG. 3, PET scanner insert 300 further comprises one or more photodetectors that convert the light photons produced by ring of scintillators 302 into electrical signals, for example, electrical currents. Note that FIG. 3 is symmetrically constructed in a way such that the light photons produced by scintillators 302 can be guided out either to the left or to the right towards two sets of photodetectors which are symmetrically located on each side of PET scanner insert 300. Also note that in FIG. 3, only four of these photodetectors (304) are visible which are located on the left-hand-side of the scanner, while other photodetectors are either in the back side of the scanner or underneath a metal shielding on the right-hand-side. However, all photodetectors are located clearly outside the central region of the scanner. Hence, in the integrated PET-MRI scanner setup, photodetectors are also outside the central region of the magnetic field of the MRI scanner, which can significantly reduce EMI between the photodetectors and the MRI scanner.

Photodetectors which are suitable for PET scanner insert 300 can generally include photomultiplier tubes (PMTs) and avalanche photodetectors (APDs), because both types have sensitivities and large gains for detecting and converting low light photons into electrical currents. In one embodiment of the present invention, the APDs are used as the photodetectors because the APDs are less sensitive to magnetic fields in comparison to the PMTs. In another embodiment of the present invention, position-sensitive APDs (PSAPDs) are selected as the photodetectors. In addition to the advantages of the typical APDs, the PSAPDs are designed to provide intrinsic position-sensing capability. This property is important in reducing the number of electronic readout channels required for each scintillator block which is described in more-details below.

Figure 5A:
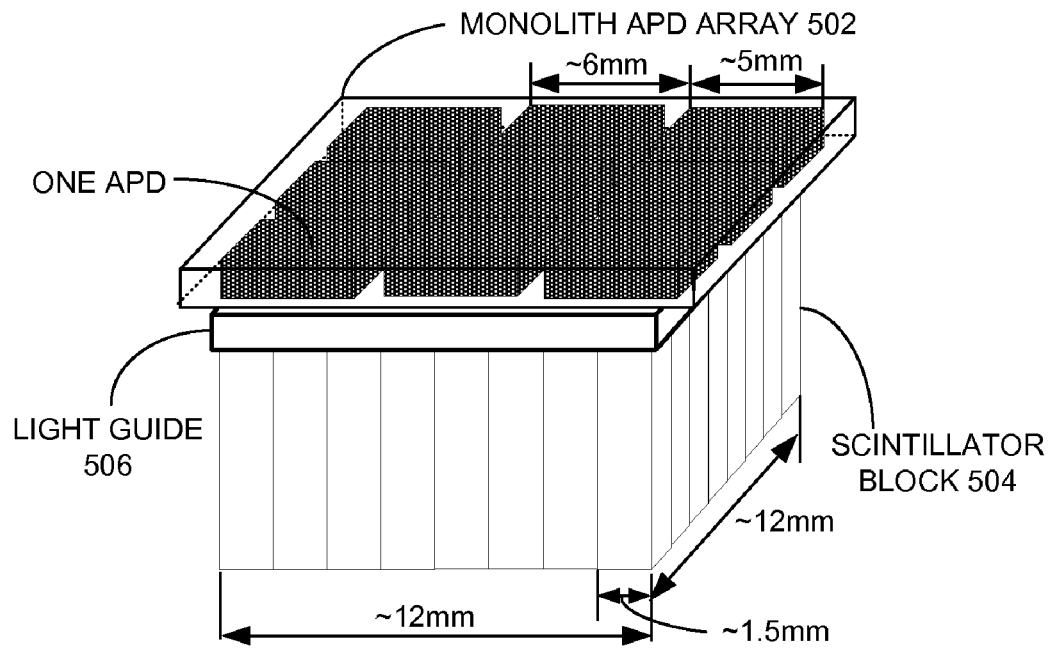
FIG. 5A illustrates using an APD array to readout a block of scintillator elements in accordance with an embodiment of the present invention.

FIG. 5A illustrates using an APD array 502 to readout a block of scintillator elements 504 in accordance with an embodiment of the present invention.

Note that typically the active surface area of a photodetector is larger than a single scintillator element in the scintillator block. For example, one embodiment of the present invention uses LSO crystal elements with $1.5 \times 1.5$ mm$^2$ cross-section areas, so that an 8×8 LSO crystal block 504 has an effective cross-section area about $12 \times 12$ mm$^2$ (would be larger due to the reflective fillings between the scintillator elements). This scintillator block can be readout using a monolithic 3×3 APD array 502 (Hamamatsu Photonics HPK, Japan), wherein each APD has a $5 \times 5$ mm$^2$ active surface area and is arranged on a ~6 mm pitch as shown in FIG. 5A. Note that each APD in array 502 has a single channel output, thus it requires at least 9 channels for using APD array 502 to readout scintillator block 504. Also note that individual APDs in an APD array can have larger or smaller active surface area than $5 \times 5$ mm$^2$. However, if the smaller APDs are used, more APDs are needed in APD array 502, thus more channels are required to readout scintillator block 504. On the other hand, if the larger APDs are used, fewer APDs and channels are needed in APD array 502. However, the noise increases as the size of the APDs increases.

Figure 5B:
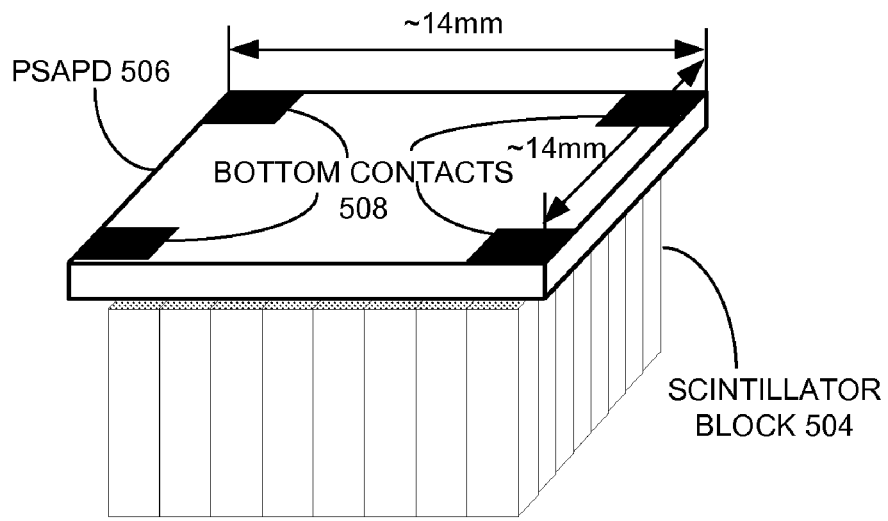
FIG. 5B illustrates using a single PSAPD to readout the block of scintillator crystals in accordance with an embodiment of the present invention.

FIG. 5B illustrates using a single PSAPD 506 to readout the block of scintillator crystals 504 in accordance with an embodiment of the present invention. In one embodiment, single PSAPD 506 has an active surface area of $14 \times 14$ mm$^2$, sufficiently large to cover the entire scintillator block 504. Typically, PSAPD 506 comprises five contacts (channels): four bottom contacts 508 which are used to get positioning information and one top contact (not shown) which is used for energy and timing information. The energy information can also be obtained using the sum of the four signals from the bottom contacts.

Using the position information obtained from four bottom contacts 508, single PSPAD 506 can resolve light outputs of individual crystals in scintillator block 504. More specifically, PSAPD 506 determines the location of the received photons by evaluating a ratio of the two opposing outputs, and further computes a 2-dimensional location for the receiving photons by using readings from all four bottom contacts. Hence, a PSAPD produces a position map for the block of scintillators which indicates the light intensity distribution across of the block of scintillators.

Note that it only requires 5 channels for detecting the same block of scintillators with PSAPD 506, a saving of 4 channels over APD array 502, which is a significant reduction in the number of electronic channels required. This is particularly important for high-resolution, small-animal PET scanners which can have a large number of scintillator elements (10000 to 20000). Using PSAPD can significantly alleviate the impact on the electronic readout requirements for APD-based PET system, thereby reducing cost as well as complexity of such small-animal PET scanners. However, the ability to position depends on the quality of the signals from the four bottom contacts, wherein higher SNR signals are desired.

Also note that in FIG. 5A, a light guide 506 is typically required to readout array of scintillators 504 and correctly identify all of them using array of single channel APDs 502. More specifically, light guide 506 can spread the light signals outputted by a single crystal within array of scintillators 504 so that it can be detected by more than one APD. However, using a light guide between the photodetectors and the scintillators may cause additional timing and energy resolution degradation. This is not an issue for using a single PSAPD to readout array of scintillators 504, because a light guide is typically not required to spread the light before the PSAPD.

Photodetector Electronics

Referring back to FIG. 3, PET scanner insert 300 further comprises associated electronics 306 for each photodetector or each photodetector array 304. Note that associated electronics 306 are mounted on dedicated printed-circuit boards (PCBs).

Typically, the associated electronics 306 include preamplifiers for amplifying the electrical signals generated by photodetectors 304. Note that these electrical signals are often in the form of small bursts of currents. In one embodiment of the present invention, the preamplifiers are charge-sensitive preamplifiers (CSPs), which are capable of integrating these bursts of currents, and producing an output that is proportional to the total charge from the burst currents.

Furthermore, the output from the CSP is often shaped with shaping amplifiers which perform three basic functions: (1) they provide an output pulse having a faster baseline restoration than the CSP output pulse (this is especially important at high count rates, where pulses from consecutive photon counting events can quickly "pile up"); (2) they filter some of the noise from the preamplifier output signal; and (3) they can also be used to provide extra gain to the signal, which may be very small (sub mV) at the preamplifier output.

In one embodiment of the present invention, non-magnetic components (e.g., non-magnetic resistors, non-magnetic capacitors) are used in associated electronics 306. In one embodiment of the present invention, non-magnetic coaxial cables are used to carry the signals from the preamplifiers to the rest of the electronics located outside of the magnetic field.

Scintillator-Optical Fiber-Photodetector Coupling

To keep photodetectors 304 and the associated electronics 306 outside of the central region of the magnetic field of the MRI scanner, photodetectors 304 are coupled to ring of scintillators 302 through optical fibers 308, which transfer light photons generated by scintillators 302 located in the central region of the magnetic field. Specifically, one end of optical fibers 308 is attached to the outputs of scintillators 302, while the other end of optical fiber 308 is attached to the input, i.e., the active surface of photodetectors 304.

Note that optical fibers 308 are grouped into optical fiber bundles, wherein each optical fiber bundle comprises a number of closely packed single optical fibers. In FIG. 3, nine optical fiber bundles with rectangular cross-section areas are clearly visible, wherein more optical fiber bundles are located in the back side of PET scanner insert 300. Note that although optical fibers are preferred for the coupling between the scintillators and photodetectors, other types of light guides may be used to couple the scintillators and photodetectors.

Because light transmission loss inside the optical fibers causes significant signal loss between the scintillator and the photodetector, the length of optical fibers has to be kept as short as possible. In practice, the length of the optical fibers for the integrated PET-MRI scanner can be decided after considering the geometry of the MR scanner and a few other factors. The final length is experimentally determined so that it can achieve the best tradeoff between reducing light transmission loss and minimizing interference between the PET scanner and MR scanner. In one embodiment of the present invention, the length of the fibers is only a fraction of the length of the main magnet of the MRI scanner.

A number of other techniques can also be used to reduce light signal losses caused by using optical fiber to deliver the light signal. For example, one can use optical fibers with one or multiple cladding layers, and/or with large numerical apertures (NA) for good light collection ability. In one embodiment of the present invention, double-cladding fibers with circular cross-section can be used. Note that optical fibers with rectangular or hexagonal cross-sections can also be used, wherein these cross-section geometries typically provide a higher packing density in the optical fiber bundle than using circular cross-section fibers.

Additionally, within each optical fiber bundle, the spaces between the optical fibers can be filled with reflective material, which facilitates reducing light transmission loss caused by light leaking through the sidewalls, and also decreasing optical crosstalk between the neighboring fibers.

Furthermore, caution must be taken when attaching the fibers to either the scintillators or the photodetectors, because improper attachment can lead to significant coupling losses. In one embodiment of the present invention, both ends of the optical fibers, and the output face of the scintillators are mechanically polished with an optically fine finish prior to attaching these components. In one embodiment of the present invention, a UV curable adhesive or an optical grease is used both as a glue and an interface material when attaching the ends of the optical fibers to the output end of the scintillators, and to the inputs of the photodetectors.

Figure 6A:
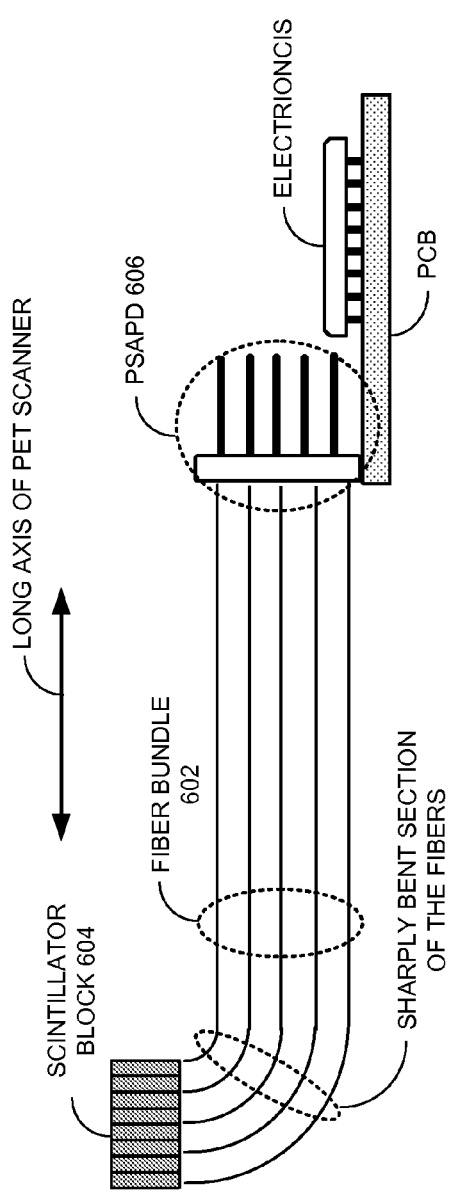
FIG. 6A illustrates one scintillator-fiber-photodetector module in the PET scanner insert in more detail in accordance with an embodiment of the present invention.

FIG. 6A illustrates one scintillator-fiber-photodetector module in PET scanner insert 300 in more detail in accordance with an embodiment of the present invention.

Note that optical fiber bundle 602 is attached between the bottom face of scintillator block 604 and the input face of a photodetector 606. In particular, optical fiber bundle 602 is sharply angled as it exits the rear of the crystals so that it can change directions from perpendicular to the main axis of PET scanner 300 to parallel to this axis (refer back to FIG. 3). This particular arrangement provides advantages in fitting the optical fiber couplers inside the bore of the main magnet of the MR scanner.

However, fiber bending, especially into such sharp angles, can contribute to 40% to 70% of the total light losses. This severe light loss is mainly due to cracking in the core and cladding caused by the stress on the fiber during bending. Studies have shown that cracking of the cladding layers can be significantly reduced by the following procedure: (1) gently heating the optical fibers to a predetermined temperature, typically around 90° C.~110° C.; (2) bending the optical fibers at the predetermined temperature; and then (3) cooling the bent optical fibers slowly back to ambient temperature.

Figure 6B:
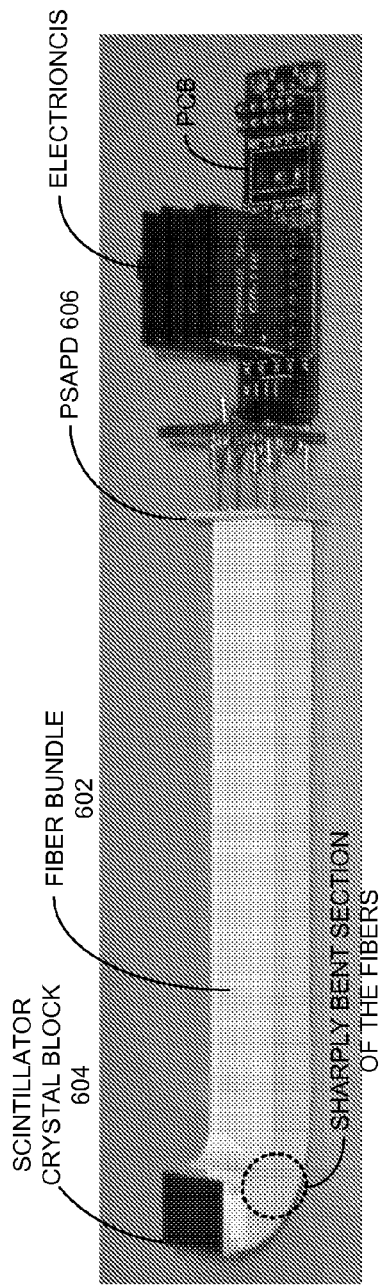
FIG. 6B presents a picture of an actual scintillator-fiber-photodetector module in accordance with an embodiment of the present invention.

FIG. 6B presents a picture of an actual scintillator-fiber-photodetector module in accordance with an embodiment of the present invention. Note that optical fiber bundle 602 is coated with a white reflective material.

Referring back to FIG. 3, a carbon-fiber tube 310 is used to mount 16 scintillator-fiber-photodetector modules, wherein half of these scintillator-fiber-photodetector modules are located on each side of PET scanner insert 300. Note that, the construction of PET scanner insert 300 ensures that there are no metal components in the central region of the scanner.

Shielding

Note that it is advantageous to shield the PET electronics including the APDs and the preamplifiers from external high frequency signals produced by the RF coils. On the other hand, shielding the PET electronics also allows shielding the RF coils of the MR scanner from any interfering radio-frequency emissions generated by the PET electronics. In one embodiment of the present invention, the PET electronics are shielded with metal housings, which are made of high frequency laminations. In one embodiment of the present invention, the high frequency lamination material is copper. However, other types of metals can also be used as the shielding material.

Note that in FIG. 3, the PET electronics on each side of PET scanner insert 300 are actually enclosed by two cylinders of metal housings, which comprise an outer metal shielding 312 and an inner metal shielding 314, and two plastic rings 316. The outer metal shielding 312 on the left-hand-side of PET scanner insert 300 is removed to expose both the PET electronics, the inner metal shielding 314 on the left-hand-side, and plastic rings 316. In one embodiment of the present invention, plastic rings 316 are covered with copper conductive tapes, which make contact with both cylinders of metal shieldings, thereby creating a complete shielding enclosure for the PET electronics (except for a few holes for outputs and power supplies, and the notches for the fibers).

Energy-Resolution and SNR for Different LSO-Fiber-Photodetector Configurations

In one embodiment of the present invention, a group of nine individual 2 mm-diameter and 10 mm long LSO crystals coupled through 20 cm optical fibers to APDs or PSAPDs are used to measure the energy resolution at 511 keV, wherein the energy resolution are measured from the full width half maximum (FWHM) of the 511 keV photopeaks. To attach the LSO crystals to the optical fibers, both are first polished as previously described and glued together using UV curable glue. Three layers of white reflectance coating (Model 6080, Munsell Color, New Windsor, N.Y.) are used as a reflector material and the measurements are performed starting after a delay of at least 12 hours to allow the reflective paint to dry.

A total of six APDs (Hamamatsu Photonics HPK, Japan) of three different sizes are investigated, wherein the active surface areas are $2\times2$ mm$^2$, $3\times3$ mm$^2$, and $5\times5$ mm$^2$. The characteristics of the six APDs, as provided by Hamamatsu are presented in Table 1. They are blue enhanced devices with 72% quantum efficiency at 420 nm (peak response at 580 nm) and a capacitance of ~3 pF/mm$^2$. Additionally, the PSAPDs (Radiation Monitoring Devices Inc, Watertown, Mass.) with an active area of 14×14 mm² are also tested. They have five contacts: four bottom contacts used to get positioning information, and a top contact which is used for energy and timing information. Typical specifications for these devices are presented in Table 2. A Cremat CR-150 evaluation board is used to couple the associated preamplifier to the Hamamatsu APDs while a custom board is made to couple the PSAPDs to the associated preamplifiers. Measurements are repeated on a 64-channel Hamamatsu PMT for comparison.

A 500 μCi Ge-68 point source is used to irradiate the crystals and energy spectra are acquired for 2 minutes using a multi-channel analyzer (MCA 8000A, Amptek, Inc, Bedford, Mass.). Additionally, energy resolution and SNR measurements are performed as a function of shaping time of the shaping amplifiers as previously described. Using a fast filter amplifier (FFA), the shaping time is varied from 5 ns to 500 ns. For the SNR measurements, a Tektronix TDS 3052 oscilloscope is used. The signal is measured as the photopeak amplitude and the noise as the peak-to-peak value on the baseline.

Figure 7:
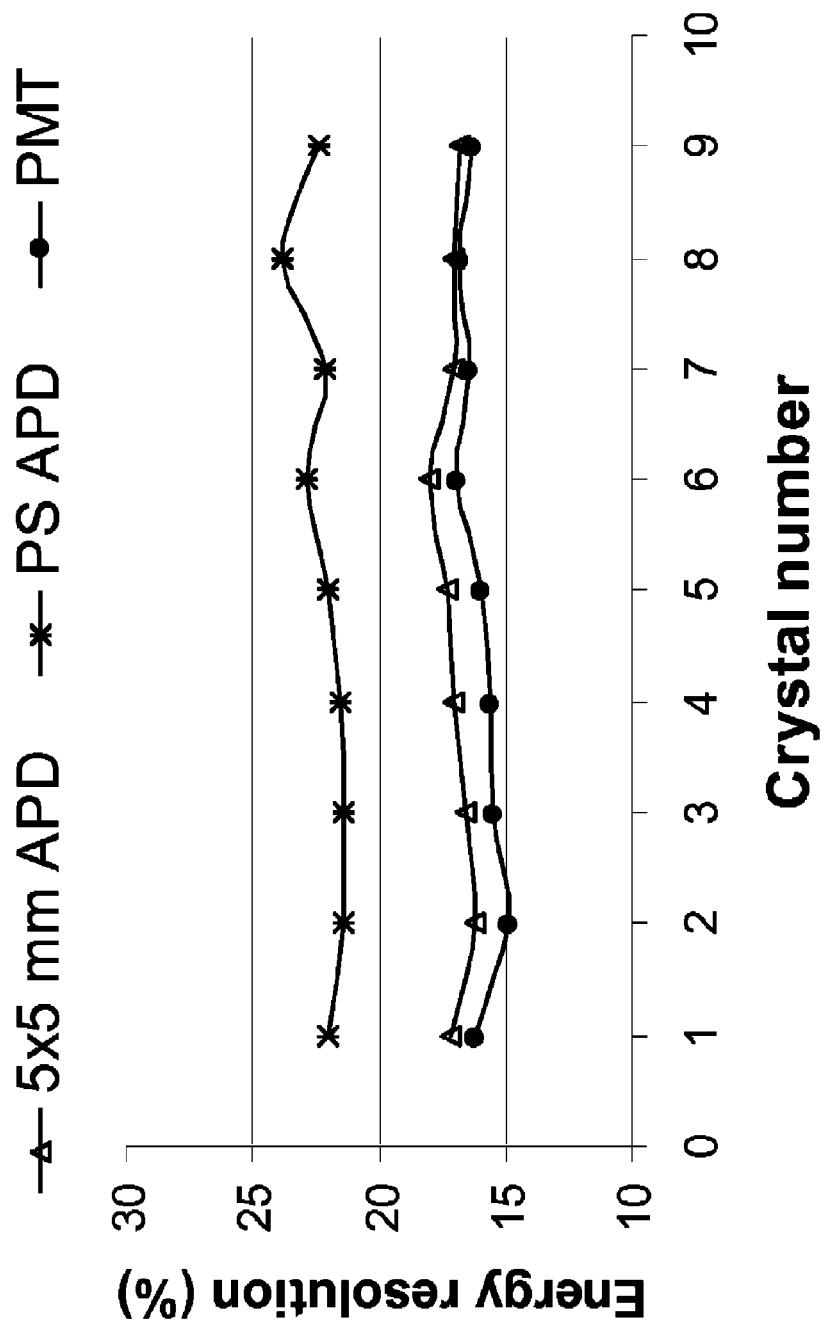
FIG. 7 illustrates the energy resolutions measured for nine LSO crystals in a prototype LSO-fiber detector with different photodetectors in accordance with an embodiment of the present invention.

FIG. 7 illustrates the energy resolutions measured for nine LSO crystals in a prototype LSO-fiber detector with different photodetectors in accordance with an embodiment of the present invention. Because the results are similar for all the APDs of different sizes, only the results for the 5×5 mm² APDs are plotted. Note that the fact that the energy resolution does not depend on APD size suggests that the energy resolution is limited by light collection, but not the noise properties of the APDs (which increases with increasing area). The LSO-fiber-APD combination shows similar energy resolution (~17%) to that measured using PMTs (~16%). However, the results of using the PSAPDs show slightly worse energy resolution (~22%). This is likely due to the larger area and capacitance of the PSAPDs. However, this is not a significant issue considering the fact that PSAPDs offer position information using only 4 channels whereas a greatly increased number of channels are needed to readout an array of crystals with single channel APDs.

Figure 8A:
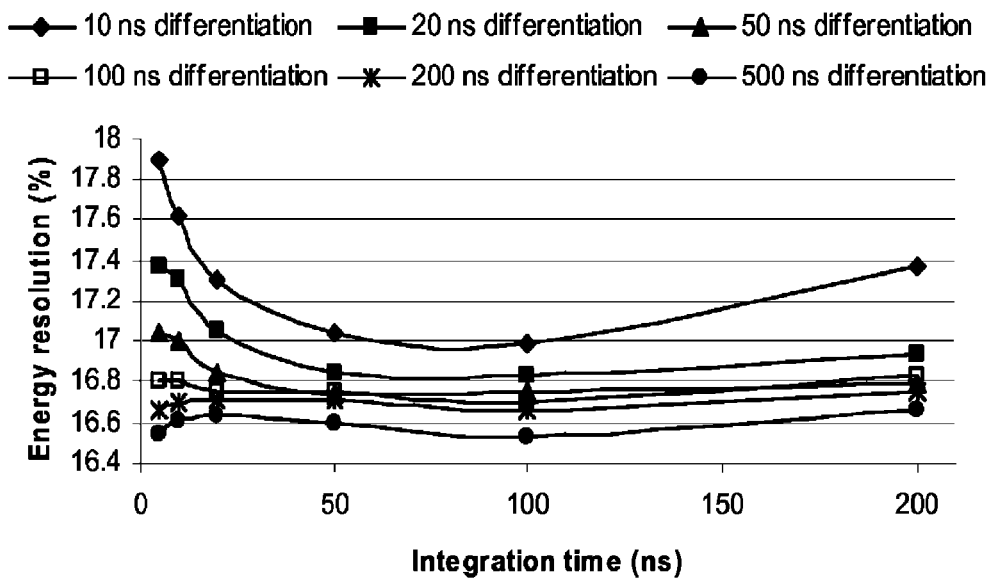
FIG. 8A illustrates the measured energy resolution as a function of different electronic shaping times for the LSO-fiber-APD configuration in accordance with an embodiment of the present invention.
Figure 8B:
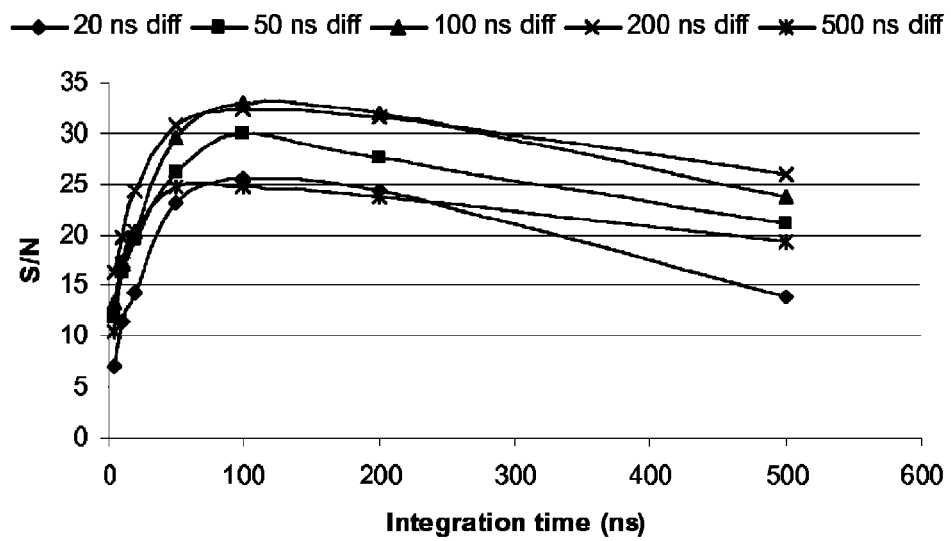
FIG. 8B illustrates the measured signal-to-noise ratio (SNR) as a function of different electronic shaping times for the LSO-fiber-APD configuration in accordance with an embodiment of the present invention.

FIGS. 8A and 8B illustrate the measured energy resolution and SNR as a function of different electronic shaping times for the LSO-fiber-APD configuration in accordance with an embodiment of the present invention. The APDs used in these plots are the 5×5 mm² area single channel APDs. Note that a shaping time of around 50 ns-100 ns is desired for good energy resolution and optimal SNR in this particular configuration.

Energy-Resolution and Spatial-Resolution of PET Scanner Insert 300

PET scanner insert 300 in FIG. 3 comprises 16 scintillator-fiber-photodetector modules, wherein each module further comprises:

An 8×8 array of LSO crystals each measuring 1.43×1.43×6 mm³ arranged with a pitch of 1.51 mm to allow space for the reflector, wherein the crystals are polished on all faces except the entrance face which is as cut;

An array of 6×6 double cladding optical fibers each measuring 2×2 mm² (Saint Gobain Crystals), wherein the radii of curvature at the 90° bend are measured to the center of the fiber range from 6-16 mm, and the straight portion of the fiber bundle is 10 cm in length;

One 14×14 mm² PSAPDs (Radiation Monitoring Devices, Inc.);

Five charge-sensitive preamplifiers (CR-110, Cremat, Inc.) mounted on printed circuit boards populated with non-magnetic components.

In order to evaluate this PET scanner, a 500 μCi Ge-68 point source is placed in the center of the scintillator ring while all sixteen LSO-fiber-PSAPD modules are measured.

Figure 9B:
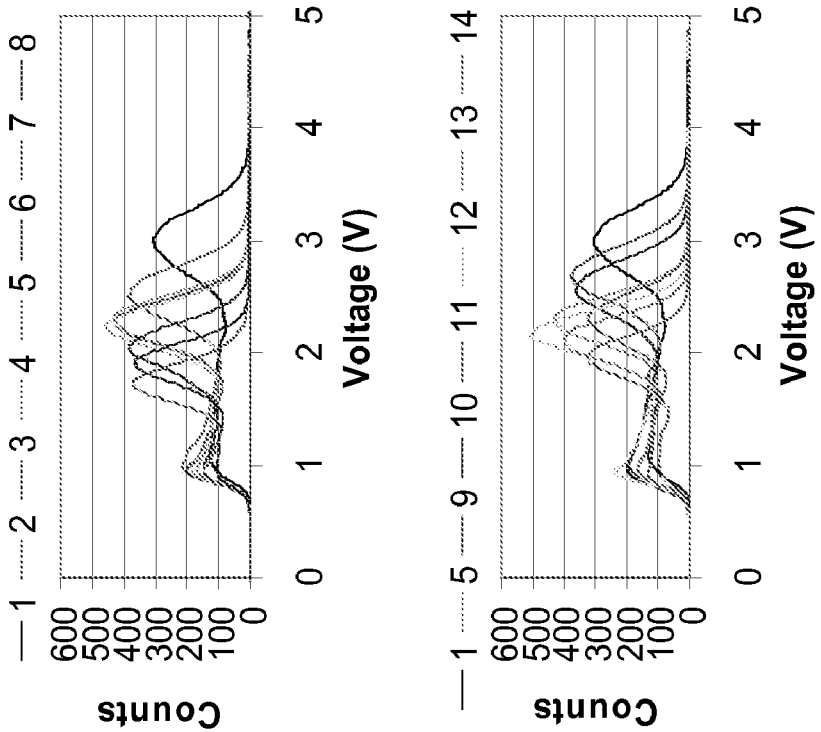
FIG. 9B illustrates the energy spectra for the selected pixels in FIG. 9A in accordance with an embodiment of the present invention.
Figure 9A:
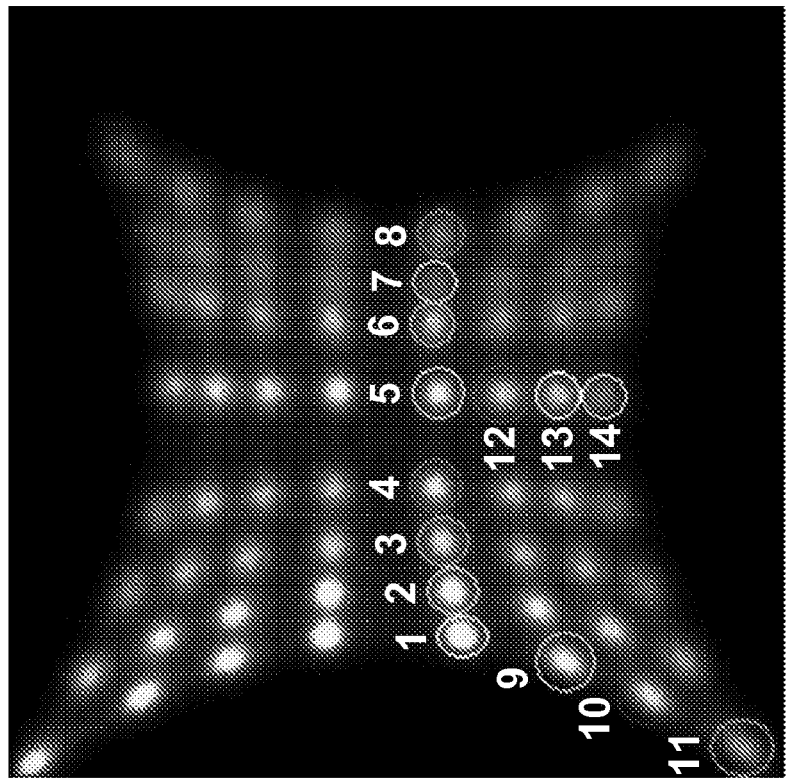
FIG. 9A illustrates a flood histogram of the data acquired using PET scanner insert 300 in response to the uniform irradiation in accordance with an embodiment of the present invention.

FIG. 9A illustrates a flood histogram of the data acquired using PET scanner insert 300 in response to the uniform irradiation in accordance with an embodiment of the present invention. Note that all 64 LSO crystals are clearly identifiable in the resulting flood histogram and the average energy resolution is computed to be ~26%.

Note that the light output, estimated based on the positions of the 511 keV photopeaks, varied across the histogram. An explanation for this variation is the light loss due to the bending of the fiber, wherein the light losses are more severe at where radii of curvature are smaller. The variations between individual crystals/fibers can also contribute to this effect.

FIG. 9B illustrates the energy spectra for the selected pixels in FIG. 9A in accordance with an embodiment of the present invention. Note that the energy spectra indicate a FWHM energy resolution of ~26%.

The results of FIGS. 9A and 9B demonstrate that PSAPDs can be effectively used to readout a large numbers of individual scintillator elements which are coupled to the PSAPDs using optical fibers, and to obtain acceptable performance with respect to energy resolution and crystal identification.

Evaluating PET Scanner and MR Scanner Interference

The interference between the PET scanner insert and a small-animal MR scanner is investigated by placing the PET scanner insert inside the magnet of a 7 Tesla Biospec MR scanner (Bruker, Germany). PET data in terms of flood histograms is acquired with and without running MR sequences and the position profiles are compared with the ones generated from the data acquired outside the magnet, in terms of energy resolution and crystal identification.

Figure 10B:
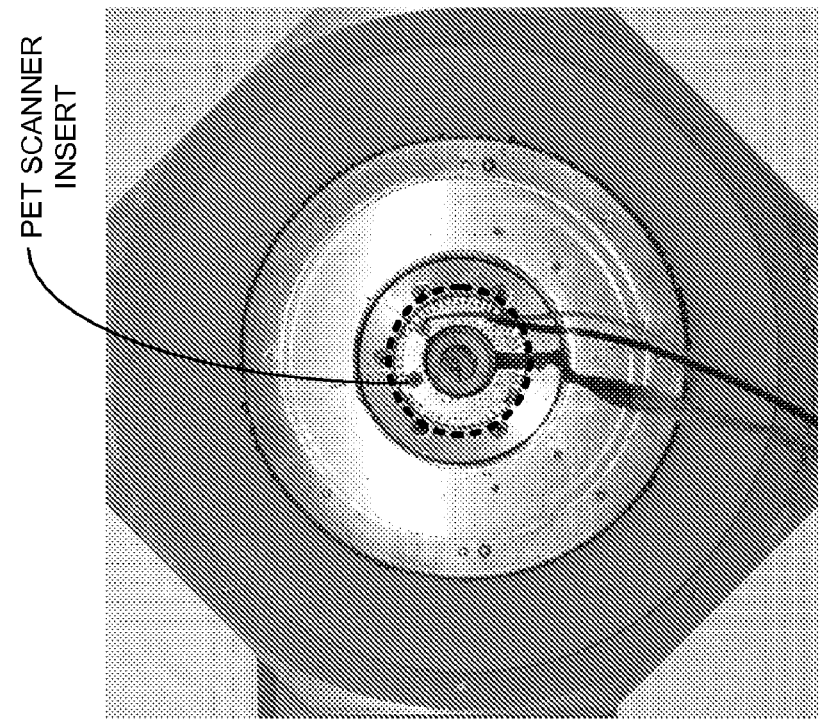
FIG. 10B presents a picture showing the end face of the PET scanner insert which is inside the MR scanner in accordance with an embodiment of the present invention.
Figure 10A:
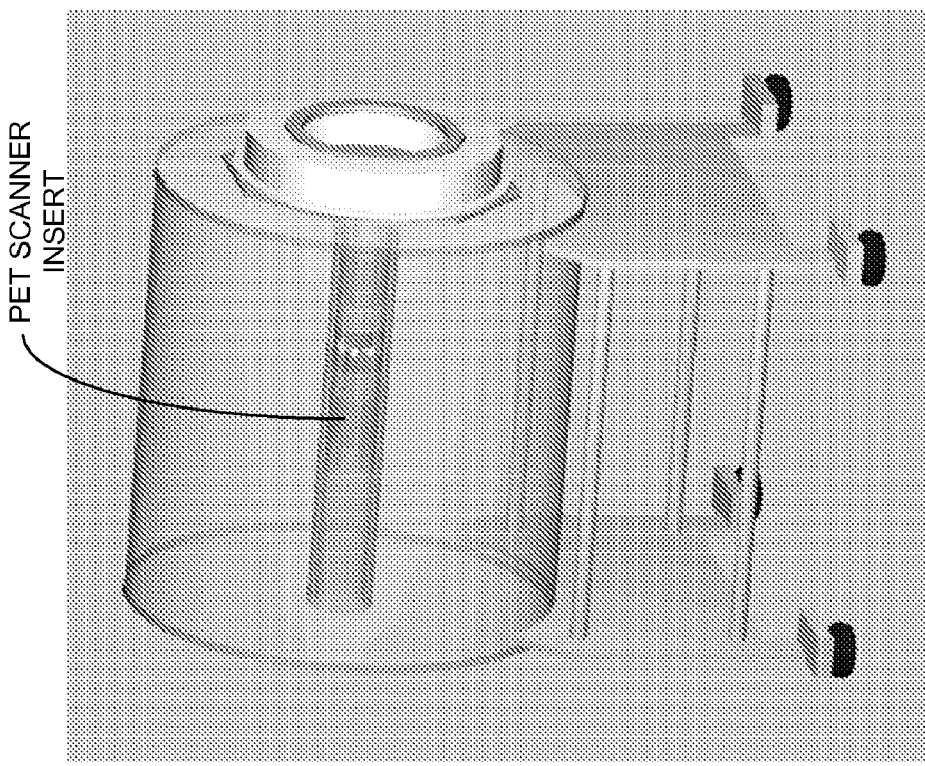
FIG. 10A presents a drawing illustrating the placement of the PET scanner inside the small-animal MR scanner in accordance with an embodiment of the present invention.

FIG. 10A presents a drawing illustrating the placement of the PET scanner inside the small-animal MR scanner in accordance with an embodiment of the present invention. FIG. 10B presents a picture showing the end face of the PET scanner insert which is inside the MR scanner in accordance with an embodiment of the present invention.

Figure 11A:
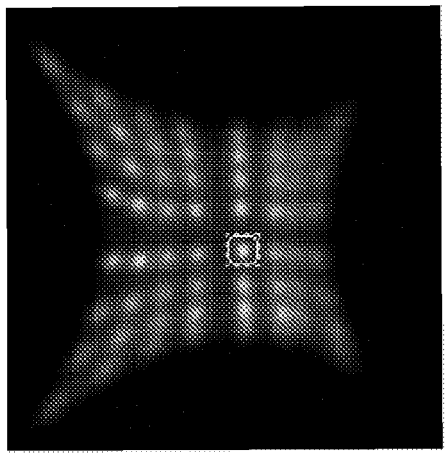
FIG. 11A presents flood histogram of the PET data acquired when the PET scanner is outside the magnet in accordance with an embodiment of the present invention.
Figure 11B:
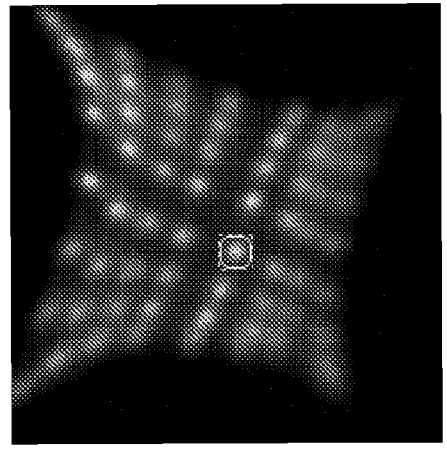
FIG. 11B presents flood histogram of the PET data acquired when the PET scanner is inside the magnet while not running MRI sequences in accordance with an embodiment of the present invention.
Figure 11C:
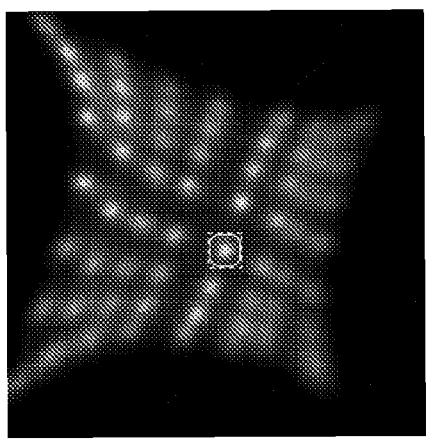
FIG. 11C presents flood histogram of the PET data acquired when the PET scanner is inside the magnet while running MRI sequences of Spin Echo in accordance with an embodiment of the present invention.
Figure 11D:
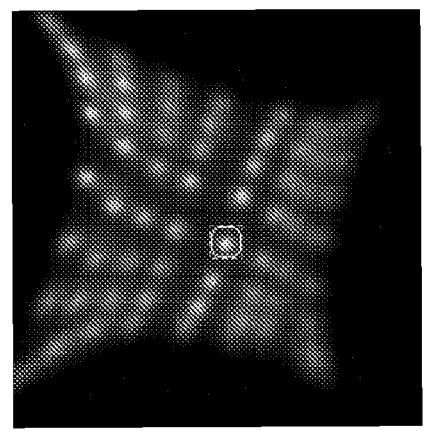
FIG. 11D presents flood histogram of the PET data acquired when the PET scanner is inside the magnet while running MRI sequences of Gradient Echo in accordance with an embodiment of the present invention.

FIGS. 11A, 11B, 11C, and 11D presents flood histograms of the PET data acquired under different conditions in accordance with an embodiment of the present invention. These conditions include when the PET scanner is: outside the magnet (FIG. 11A); inside the magnet while not running MRI sequences (FIG. 11B); inside the magnet while running MRI sequences of Spin Echo (FIG. 11C); and inside the magnet while running MRI sequences of Gradient Echo (FIG. 11D). Note that all above data are acquired at 0° C.

Note that individual crystal elements are clearly identifiable and no changes in energy resolution are observed (~25% for the highlighted crystal element) under all conditions. The pincushion distortion is specific to PSAPDs with a four corner anode design. The slight rotation which is observed in the flood diagrams in FIGS. 11B to 11D is related to the high resistivity anode layer located on the backside of the PSAPDs. Because the distortion does not change in the flood diagrams of FIGS. 11B to 11D, it suggests that this artifact is not related to running of pulse sequences but rather to the static magnetic field of the MRI scanner. Hence, as long as individual crystal elements can be clearly separated to create crystal look-up tables, this artifact is not an issue from a PET imaging perspective.

Figure 12A:
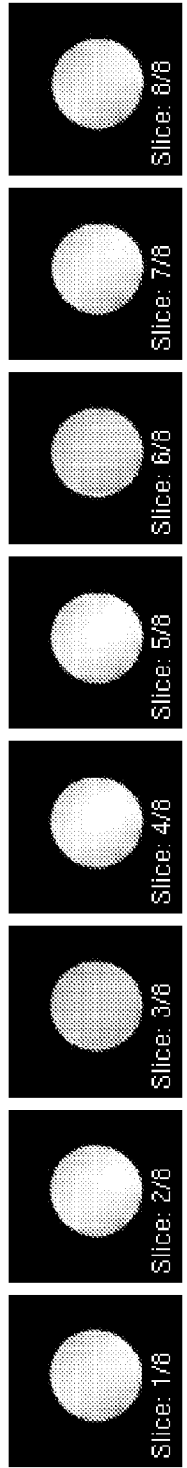
FIG. 12A illustrates the MR images of a Magnevist/$H_2O$ phantom (T1=250 ms) acquired without the PET scanner insert in accordance with an embodiment of the present invention.
Figure 12B:
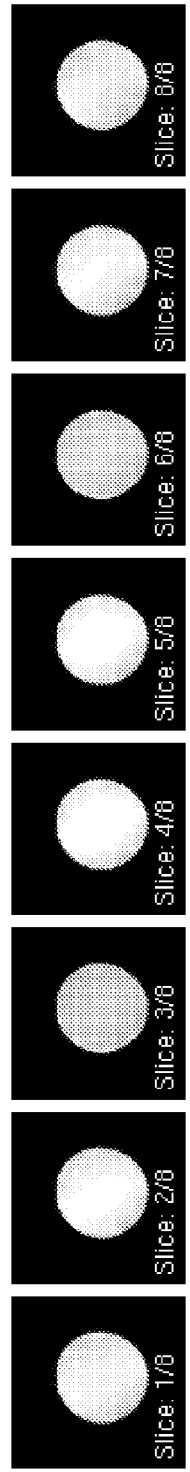
FIG. 12B illustrates the MR images of a Magnevist/$H_2O$ phantom (T1=250 ms) acquired with the PET scanner insert which is not powered in accordance with an embodiment of the present invention.
Figure 12C:
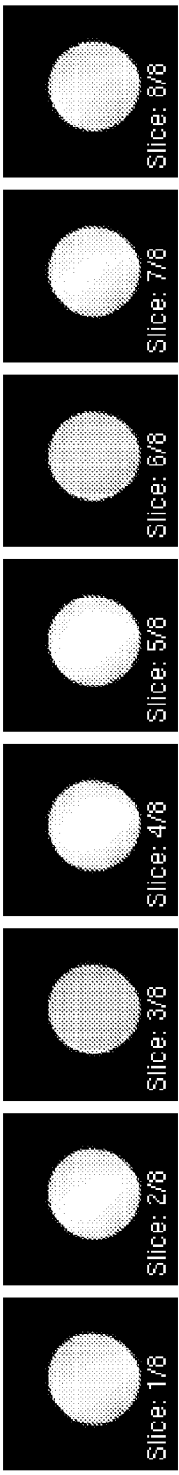
FIG. 12C illustrates the MR images of a Magnevist/$H_2O$ phantom (T1=250 ms) acquired with the PET scanner insert which is powered in accordance with an embodiment of the present invention.

On the other hand, the MR data is acquired to evaluate the effect of the PET scanner insert on the MR data acquisition. Specifically, a uniform cylindrical MR phantom containing Magnevist® in water (T1=250 ms) is imaged with and without the PET scanner insert. FIGS. 12A, 12B, and 12C illustrate the MR images of a Magnevist/$H_2O$ phantom (T1=250 ms) acquired under different conditions in accordance with an embodiment of the present invention. These conditions include: MR imaging without the PET scanner insert (FIG. 12A); MR imaging with the PET scanner insert which is not powered (FIG. 12B); and MR imaging with the PET scanner insert which is powered (FIG. 12C).

A ParaVision® software package (Bruker, Germany) running on a Linux workstation is used for the image reconstruction and display. A small-animal 35 mm RF coil placed inside the PET scanner insert is used for these experiments. The MRI sequences performed are Spin Echo (TR=1000 ms, TE=11.6 ms) and Gradient Echo (TR=500 ms, TE=4.1 ms, flip angle=30°. The matrix size in all cases is 128×128.

As observed in all images of FIG. 12, there are no obvious visual artifacts or signal-to-noise loss in the MR data due to the presents of the PET insert, either under powered condition or not powered condition.

Hence, LSO-optical fiber-ASAPD PET detector and the associated electronics work with no obvious performance degradation in the 7 Tesla MR scanner, both from the PET and MRI imaging perspectives.

Note that although we described the above results for a high-field MRI, the integrated PET-MRI scanner of this invention can also include a low-field MRI. Additionally, although we show a system suitable for small animal imaging, the integrated PET-MRI scanner of this invention can also be extended to image larger subjects, such as humans.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An integrated positron emission tomography (PET)-magnetic resonance imaging (MRI) scanner, comprising:
   a main magnet that generates a magnetic field during an MRI process for a subject, wherein the image is generated in a central region of the magnetic field;
   a PET scanner that detects annihilation photons produced by positron decays within a subject during a PET imaging process, wherein the PET scanner is enclosed by the main magnet, wherein the PET scanner further comprises:
   at least one ring of scintillators that detect positron annihilation photons and output light photons in response to the detected positron annihilation photons, wherein the ring of scintillators is situated in the central region of the magnetic field; and
   one or more photodetectors that convert the light photons output by the ring of scintillators into electrical signals, wherein the photodetectors are coupled to the ring of scintillators, such that the photodetectors are located outside of the central region of the magnetic field, and wherein the photodetectors are enclosed by the main magnet, such that length of an optical fiber coupling the photodetectors and the ring of scintillators is below a predetermined value; and
   a set of radio frequency (RF) coils that transmit signals to and receive signals from the subject during the MRI process, wherein the set of RF coils are enclosed by the PET scanner; and
   a shield configured to shield the photodetectors and associated circuitry of the PET scanner from the RF signals generated by the RF coils of the MRI;
   wherein keeping the photodetectors and associated circuitry outside of the central region of the magnetic field reduces the electromagnetic interference (EMI) between the PET scanner and the MRI scanner, and wherein keeping the length of the optical fiber below the predetermined value reduces light transmission loss within the optical fiber.

2. The integrated PET-MRI scanner of claim 1, wherein the photodetectors are coupled to the ring of scintillators through optical fibers, wherein one end of the optical fibers is attached to the outputs of the scintillators, while the other end of the optical fibers is attached to the inputs of the photodetectors, wherein the optical fibers transfer the photons outputted by the ring of scintillators to the photodetectors, wherein using the optical fibers facilitates keeping the photodetectors outside of the central region of the magnetic field.

3. The integrated PET-MRI scanner of claim 2, wherein the optical fibers are a fraction of the size of the main magnet, which limits light transmission loss.

4. The integrated PET-MRI scanner of claim 2, wherein the optical fibers include at least one cladding layer which reduces light transmission loss.

5. The integrated PET-MRI scanner of claim 2, wherein the optical fibers include more than one cladding layer which reduces light transmission loss.

6. The integrated PET-MRI scanner of claim 2, wherein the spaces between the optical fibers are filled with reflective material which reduces light transmission loss and decreases optical crosstalk between the optical fibers.

7. The integrated PET-MRI scanner of claim 2, wherein the optical fibers are bent sharply near the ring of scintillators in order to fit the optical fibers inside the main magnetic of the MRI.

8. The integrated PET-MRI scanner of claim 2, wherein the optical fibers can have:
   circular cross-section;
   rectangular cross-section; or
   hexagonal cross-section.

9. The integrated PET-MRI scanner of claim 1, wherein the at least one ring of scintillators includes multiple rings of scintillators to facilitate multi slice PET scanning.

10. The integrated PET-MRI scanner of claim 1, wherein the circuitry associated with the photodetectors includes amplifiers for amplifying the electrical signals generated by the photodetectors.

11. The integrated PET-MRI scanner of claim 10, wherein the amplifiers are charge sensitive preamplifiers (CSPs).

12. The integrated PET-MRI scanner of claim 1, wherein the scintillators comprises at least one of:
   lutetium oxyorthosilicate (LSO) crystals;
   bismuth germinate (BGO) crystals;
   gadolinium oxyorthosilicate (GSO) crystals,
   LYSO (a mixture of LSO and yttrium oxyorthosilicate) crystals; and
   mixed lutetium silicates (MLS) crystals.

13. The integrated PET-MRI scanner of claim 1, wherein the photodetectors comprise at least one of:
   avalanche photodetectors (APDs); and
   position sensitive photodetectors (PSPDs), which include position sensitive avalanche photodiodes (PSAPDs).

14. The integrated PET-MRI scanner of claim 13, wherein each PSAPD is used to readout a block or an array of scintillators in the ring of scintillators.

15. The integrated PET-MRI scanner of claim 14, wherein the PSAPD produces a position map for the block or the array of scintillators which indicates the light intensity distribution across of the block or the array of scintillators.

16. The integrated PET-MRI scanner of claim 13, wherein an array of the APDs is used to readout a block or an array of scintillators in the ring of scintillators.

17. The integrated PET-MRI scanner of claim 1, wherein the photodetectors and associated circuitry of the PET scanner are contained within a magnetic field produced by the main magnet of the MRI.

18. The integrated PET-MRI scanner of claim 1, wherein the MRI can be:
   a low field MRI; or
   a high field MRI.

* * * * *